US 012142622B2

(12) United States Patent
Kao

(10) Patent No.: US 12,142,622 B2
(45) Date of Patent: Nov. 12, 2024

(54) SENSING DEVICE

(71) Applicant: Au Optronics Corporation, Hsinchu (TW)

(72) Inventor: Yi-Chun Kao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 557 days.

(21) Appl. No.: 17/361,218

(22) Filed: Jun. 28, 2021

(65) Prior Publication Data

US 2022/0052090 A1 Feb. 17, 2022

Related U.S. Application Data

(60) Provisional application No. 63/066,416, filed on Aug. 17, 2020.

(30) Foreign Application Priority Data

Feb. 9, 2021 (TW) .................. 110105004

(51) Int. Cl.
  *H01L 27/146* (2006.01)
  *H04N 25/75* (2023.01)
  *H04N 25/77* (2023.01)

(52) U.S. Cl.
  CPC .. *H01L 27/14621* (2013.01); *H01L 27/14607* (2013.01); *H01L 27/14625* (2013.01);
  (Continued)

(58) Field of Classification Search
  CPC ......... H01L 27/14621; H01L 27/14607; H01L 27/14625; H04N 25/75; H04N 25/77
  See application file for complete search history.

(56) References Cited

U.S. PATENT DOCUMENTS 5,990,506 A 11/1999 Fossum et al.
8,872,298 B2 10/2014 Ahn et al.
(Continued)

FOREIGN PATENT DOCUMENTS

CN 108615746 10/2018
CN 109673167 4/2019
(Continued)

OTHER PUBLICATIONS

Murray, et al., "Synthesis and Characterization of Nearly Monodisperse CdE (E=S, Se, Te) Semiconductor Nanocrystallites," J.Am.Chem. Soc. 1993,115,8706-8715. (Year: 1993).*
(Continued)

*Primary Examiner* — Herve-Louis Y Assouman
*Assistant Examiner* — Linda J. Fleck
(74) *Attorney, Agent, or Firm* — JCIPRNET

(57) ABSTRACT

A sensing device includes a light-emitting panel and a sensing pixel array structure. The light-emitting panel is adapted to emit an initial light with a first waveform. The sensing pixel array structure includes a plurality of first sensing pixel structures and at least one second sensing pixel structure. The first sensing pixel structures provide the initial light with the first waveform as a first sensing light to a first sensing element for sensing. The first sensing pixel structures occupy 90% or more but less than 100% of a configuration area of the overall sensing pixel array structure. The second sensing pixel structure includes a second sensing element and a light conversion layer. The second sensing pixel structure is adapted to adjust the initial light with the first waveform to a second sensing light with a second waveform to be sensed by the second sensing element.

14 Claims, 8 Drawing Sheets

(52) U.S. Cl.
CPC ....... H01L 27/14645 (2013.01); H04N 25/75 (2023.01); H04N 25/77 (2023.01)

(56) References Cited

U.S. PATENT DOCUMENTS

| | | | |
|---|---|---|---|
| 9,635,325 B2 | 4/2017 | Borthakur | |
| 10,185,066 B2 * | 1/2019 | Chae | H10K 59/38 |
| 11,048,910 B2 * | 6/2021 | Li | G06V 40/1318 |
| 11,423,691 B2 * | 8/2022 | Moon | G06V 40/1394 |
| 11,610,431 B2 * | 3/2023 | Lee | G06V 40/1365 |
| 2003/0108083 A1 * | 6/2003 | Seitz | G01J 5/08 |
| | | | 348/E5.09 |
| 2003/0133029 A1 * | 7/2003 | Booth, Jr. | H01L 27/14627 |
| | | | 348/E5.04 |
| 2009/0146237 A1 * | 6/2009 | Yun | H01L 27/14685 |
| | | | 257/E31.127 |
| 2010/0157091 A1 * | 6/2010 | Honda | H04N 23/843 |
| | | | 348/E9.051 |
| 2018/0157083 A1 * | 6/2018 | Yeo | G02F 1/133514 |
| 2018/0352199 A1 * | 12/2018 | Hwang | H04N 9/01 |
| 2019/0012512 A1 | 1/2019 | He et al. | |
| 2019/0019000 A1 * | 1/2019 | Lee | G02B 5/204 |
| 2019/0064603 A1 * | 2/2019 | Lee | G02B 6/0091 |
| 2020/0056091 A1 * | 2/2020 | Piquette | H01L 33/505 |
| 2020/0097696 A1 * | 3/2020 | Yao | G06V 40/1365 |
| 2020/0104562 A1 | 4/2020 | Sung et al. | |
| 2020/0193138 A1 * | 6/2020 | Li | G06V 10/82 |
| 2022/0020943 A1 * | 1/2022 | Chung | H10K 59/60 |
| 2022/0245374 A1 * | 8/2022 | Huang | H01L 27/14621 |
| 2023/0170363 A1 * | 6/2023 | Huang | G06T 3/4015 |
| | | | 257/432 |

FOREIGN PATENT DOCUMENTS

| | | | | |
|---|---|---|---|---|
| CN | 109873005 | | 6/2019 | |
| CN | 111291719 | | 6/2020 | |
| CN | 111291719 A | * | 6/2020 | .......... G06K 9/0004 |
| JP | 2011107508 A | * | 6/2011 | |
| KR | 20190080171 A | * | 7/2019 | |
| TW | 201911111 | | 3/2019 | |

OTHER PUBLICATIONS

"Office Action of India Counterpart Application", issued on May 12, 2022, p. 1-p. 6.

* cited by examiner

SENSING DEVICE

CROSS-REFERENCE TO RELATED APPLICATION

This application claims the priority benefit of U.S. Provisional Application No. 63/066,416, filed on Aug. 17, 2020 and Taiwan application serial no. 110105004, filed on Feb. 9, 2021. The entirety of each of the above-mentioned patent applications is hereby incorporated by reference herein and made a part of this specification.

BACKGROUND OF THE INVENTION

Field of the Invention

The invention relates to a sensing device, and more particularly to a sensing device having at least two sensing pixel structures.

Description of Related Art

The fingerprint identification function may support a variety of applications, enhance user experience, and increase added value, and is currently one of the key development projects in the industry. In the existing fingerprint sensing device, in addition to a sensing structure for fingerprint identification, a sensing structure for fingerprint anti-counterfeiting is also provided to identify the authenticity of a fingerprint. The sensing structure for fingerprint anti-counterfeiting is often used with a color filter layer such as a color resist to implement anti-counterfeiting identification. After the light reflected by the fingerprint passes through the color filter layer, the amount of light is reduced by about 2/3, and therefore the sensing elements in the fingerprint anti-counterfeiting sensing structure may only receive about 1/3 of the amount of light. As a result, the strength of the signal received by the sensing elements is reduced. Therefore, how to improve the sensitivity of the sensing elements and the strength of the signal received by the sensing elements, and the like, has become a topic of concern to researchers.

SUMMARY OF THE INVENTION

The invention provides a sensing device with a design that may help increase the amount of light received by a sensing element, thereby improving the quality of the sensing device.

At least one embodiment of the invention provides a sensing device including a light-emitting panel and a sensing pixel array structure. The light-emitting panel is adapted to emit an initial light with a first waveform. The sensing pixel array structure is located on a back side of the light-emitting panel, and the sensing pixel array structure includes a plurality of first sensing pixel structures and at least one second sensing pixel structure. Each of the first sensing pixel structures includes a first sensing element, and each of the first sensing pixel structures provides the initial light with the first waveform as a first sensing light to the first sensing element for sensing, wherein a ratio of the plurality of first sensing pixel structures in a configuration area of an overall sensing pixel array structure is 90% or more but less than 100%. The at least one second sensing pixel structure includes a second sensing element and a light conversion layer. The light conversion layer is located between the second sensing element and the light-emitting panel. The at least one second sensing pixel structure is adapted to adjust the initial light with the first waveform to a second sensing light to be provided to the second sensing element for sensing, and the second sensing light has a second waveform different from the first waveform. The light conversion layer has an excitation peak wavelength and the excitation peak wavelength is in a range of 400 nm to 750 nm.

In an embodiment of the invention, the light-converting layer includes a quantum dot.

In an embodiment of the invention, the second sensing light includes a converted light obtained by converting a portion of the initial light via the light conversion layer and another portion of the initial light passing through the light conversion layer but not converted by the light conversion layer.

In an embodiment of the invention, the at least one second sensing pixel structure further includes a light-collimating structure and a lens sequentially stacked on the second sensing element.

In an embodiment of the invention, the light conversion layer of the at least one second sensing pixel structure is located between the lens and the sensing element.

In an embodiment of the invention, the light conversion layer of the at least one second sensing pixel structure is located between the light-emitting panel and the lens.

In an embodiment of the invention, the sensing device further includes at least one third sensing pixel structure. The at least one third sensing pixel structure includes a third sensing element and a color filter layer. The color filter layer is located between the third sensing element and the light-emitting panel. The at least one third sensing pixel structure is adapted to adjust the initial light with the first waveform to a third sensing light to be provided to the third sensing element for sensing, and the third sensing light has a third waveform different from the first waveform.

In an embodiment of the invention, a ratio of the at least one second sensing pixel structure and the at least one third sensing pixel structure to a configuration area of an overall sensing pixel array structure is less than 10%, but more than 0%.

In an embodiment of the invention, the first waveform is in a wavelength range of 400 nm to 700 nm.

At least another embodiment of the invention provides a sensing device including a sensing pixel array structure. The sensing pixel array structure includes a plurality of first sensing pixel structures and at least one second sensing pixel structure arranged in an array. The plurality of first sensing pixel structures occupy 90% or more but less than 100% of a configuration area of an overall sensing pixel array structure. Each of the first sensing pixel structures includes a first sensing element, and each of the first sensing pixel structures provides an initial light with a first waveform as a first sensing light to the first sensing element for sensing. The at least one second sensing pixel structure includes a second sensing element, the at least one second sensing pixel structure is adapted to adjust the initial light with the first waveform to a second sensing light to be provided to the second sensing element for sensing, and a second waveform of the second sensing light is different from the first waveform.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated

DESCRIPTION OF THE EMBODIMENTS

Figure 1:
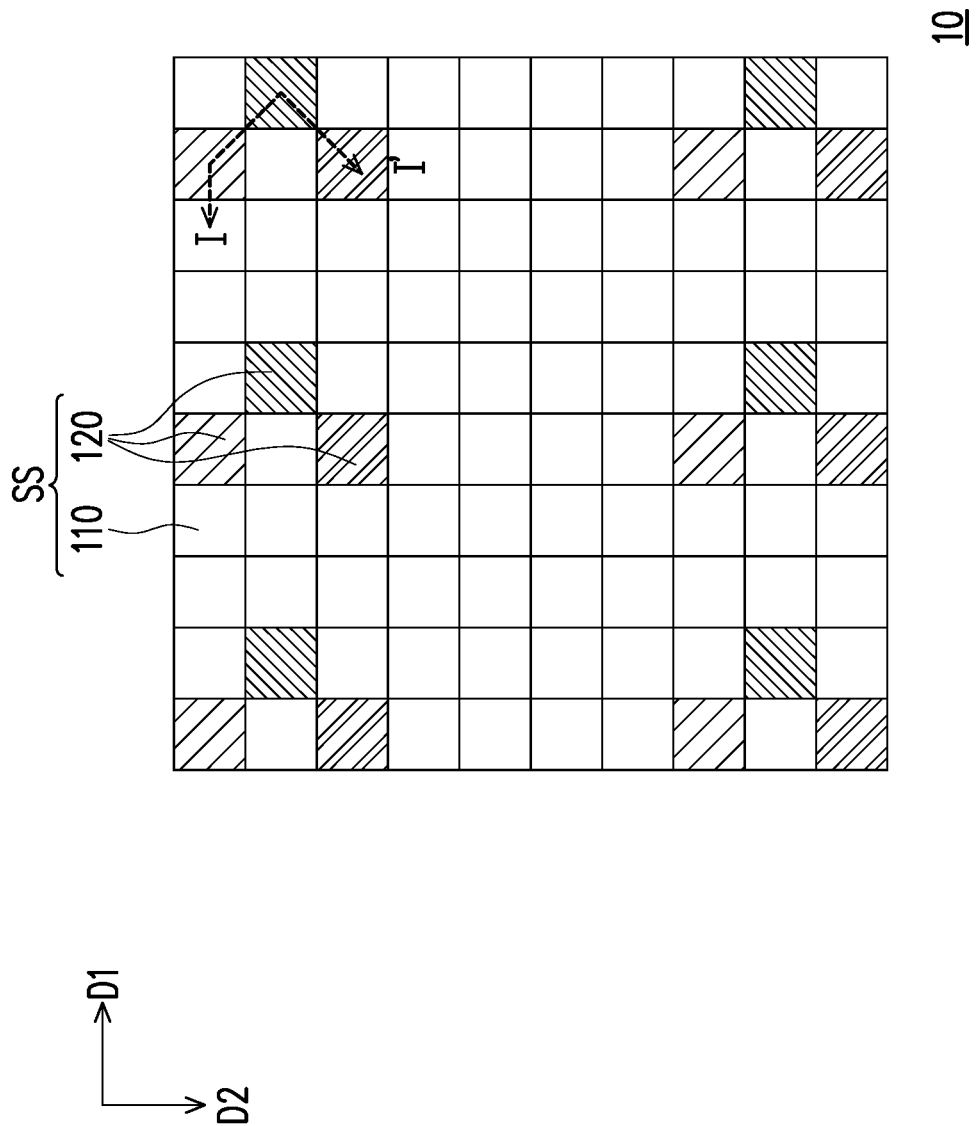
FIG. 1 is a schematic top view of a sensing device according to an embodiment of the invention.

In the figures, for clarity, the thicknesses of, for instance, layers, films, panels, and regions are enlarged. In the entire specification, the same reference numerals represent the same elements. It should be understood that, when a layer, film, region, or an element of a substrate is "on another element" or "connected to another element", "overlapped with another element", the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

It should be understood that, even though terms such as "first", "second", "third", etc., in the specification may be used herein to describe various components, members, regions, layers, and/or parts, these components, members, regions, and/or parts should not be limited by these terms. These terms are only used to distinguish one element, member, region, layer, or part from another element, member, region, layer, or part. Therefore, the "first element," "member," "region," "layer," or "portion" discussed below may be referred to as a second element, member, region, layer, or portion without departing from the teachings herein.

The terminology used here is only for the object of describing specific embodiments and is not limiting. As used herein, unless the content clearly indicates otherwise, the singular forms "a", "one", and "the" are intended to include the plural form, including "at least one". "Or" means "and/or". As used in the specification, the term "and/or" includes any and all combinations of one or a plurality of the associated listed items. It should also be understood that when used in the specification, the term "including" and/or "containing" specifies the stated features, regions, wholes, steps, operations, presence of members and/or members, but does not exclude the presence or addition of one or a plurality of other features, regions, wholes, steps, operations, members, parts, and/or a combination thereof.

In addition, relative terms such as "lower" or "bottom" and "upper" or "top" may be used herein to describe the relationship of one member to another member as shown in the figure. It should be understood that relative terms are intended to encompass different orientations of the device in addition to the orientation shown. For example, if the device in one figure is turned over, an element described as being on the "lower" side of the other elements is oriented to being on the "upper" side of the other elements. Thus, the exemplary term "below" may include the orientations "below" and "above", depending on the particular orientation of the figure. Similarly, if the device in one figure is turned over, an element described as "below" other elements or an element "below" is oriented "above" the other elements. Thus, the exemplary term "under" or "above" may encompass the orientations of above and below.

"About", "substantially", or "similar" used in the specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or within ±30%, ±20%, ±10%, or ±5%. Moreover, "about", "substantially", or "similar" used in the specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

In the present specification, exemplary embodiments are described with reference to cross-sections of schematics used as ideal embodiments. Therefore, changes in shape of figures used as the results of, for instance, manufacturing techniques and/or tolerance may be expected. Therefore, the embodiments of the invention should not be construed to limit the specific shapes of the regions shown in the present specification, but instead include shape deviations caused by, for instance, manufacture. For example, regions shown or described as flat generally may have rough and/or non-linear features. Moreover, an acute angle shown may be round. Therefore, the regions shown in the figures are substantially schematic, and the shapes thereof do not refer to the accurate shapes of the regions shown, and also do not limit the scope of the claims.

FIG. 1 is a schematic top view of a sensing device according to an embodiment of the invention. Please refer to FIG. 1, a sensing device 10 includes a sensing pixel array structure SS. In the present embodiment, the sensing pixel array structure SS includes a plurality of first sensing pixel structures 110 and at least one second sensing pixel structure 120 arranged in an array.

The plurality of first sensing pixel structures 110 and a plurality of second sensing pixel structures 120 may be arranged in an array along a first direction D1 and a second direction D2, respectively. In the present embodiment, the first direction D1 and the second direction D2 are intersected, but the invention is not limited thereto. In an embodiment, the first sensing pixel structures 110 are used as sensing pixel structures for fingerprint identification, and the second sensing pixel structures 120 are used for anti-counterfeiting identification. In other words, although the first sensing pixel structures 110 and the second sensing pixel structures 120 may also provide a sensing function, they may be used to distinguish different information. As shown in FIG. 1, the number of the first sensing pixel structures 110 may be more than the number of the second sensing pixel structures 120.

In the present embodiment, although a plurality of second sensing pixel structures 120 are used as an example, the invention is not limited thereto. In some embodiments, the sensing pixel structures arranged in an array to form the sensing pixel array structure SS may include only a single second sensing pixel structure. In other words, the sensing pixel array structure SS may only have a single second sensing pixel structure 120 for anti-counterfeiting identification, and the remaining sensing pixel structures are all the first sensing pixel structures 110 for fingerprint identification.

In the present embodiment, the ratio of the configuration area of the first sensing pixel structures 110 in the overall sensing pixel array structure SS is greater than the ratio of the configuration area of the second sensing pixel structures 120 in the overall sensing pixel array structure SS. For example, the first sensing pixel structures 110 preferably occupy 90% or more but less than 100% of the configuration area of the overall sensing pixel array structure SS. In other words, the second sensing pixel structures 120 preferably occupy 10% or more of the configuration area of the overall sensing pixel array structure SS. In addition, the lower limit of the ratio of the configuration area of the second sensing pixel structures 120 in the overall sensing pixel array structure SS is not particularly limited, as long as it is greater than 0%.

The arrangement of the second sensing pixel structures 120 in the sensing pixel array structure SS may be adjusted according to different requirements. For example, as shown in FIG. 1, the second sensing pixel structures 120 are arranged in groups of three in the sensing pixel array structure SS, and the three second sensing pixel structures 120 in each group are arranged in a staggered arrangement along the second direction D2. Here, the three second sensing pixel structures 120 staggered along the second direction D2 form a V shape with an opening toward the left side of FIG. 1, for example. In the first direction D1, there are, for example, three first sensing pixel structures 110 spaced between two adjacent second sensing pixel structures 120. Moreover, in the second direction D2, the first sensing pixel structures 110 arranged in four rows along the first direction D1 are spaced between two adjacent groups of second sensing pixel structures 120, for example. In other embodiments, the three second sensing pixel structures 120 may also be arranged in a straight line, a diagonal line, or be in a scattered arrangement along the second direction D2. Those having ordinary in the art may adjust the number and arrangement of the second sensing pixel structures 120 according to design requirements, and the invention is not limited thereto.

In the present embodiment, the first sensing pixel structures 110 and the second sensing pixel structures 120 may have different structural designs to provide different sensing functions. When the same initial light is incident on the first sensing pixel structures 110 and the second sensing pixel structures 120, the first sensing pixel structures 110 may directly use the initial light with a first waveform as a first sensing light for sensing, and the second sensing pixel structures 120 may adjust the initial light with the first waveform to a second sensing light with a second waveform to sense the second sensing light. The first sensing pixel structures 110 and the second sensing pixel structures 120 respectively sense sensing light with different waveforms to generate different identification signals. The sensing device 10 may analyze the signals sensed by different sensing pixel structures via an algorithm to determine whether the fingerprint signal sensed by the sensing pixel array structure SS is abnormal, so as to identify the authenticity of the fingerprint signal obtained.

Hereinafter, implementations applicable to the first sensing pixel structures and the second sensing pixel structures in the above embodiment are illustrated by way of example, but the invention is not limited to the following implementations.

Figure 2A:
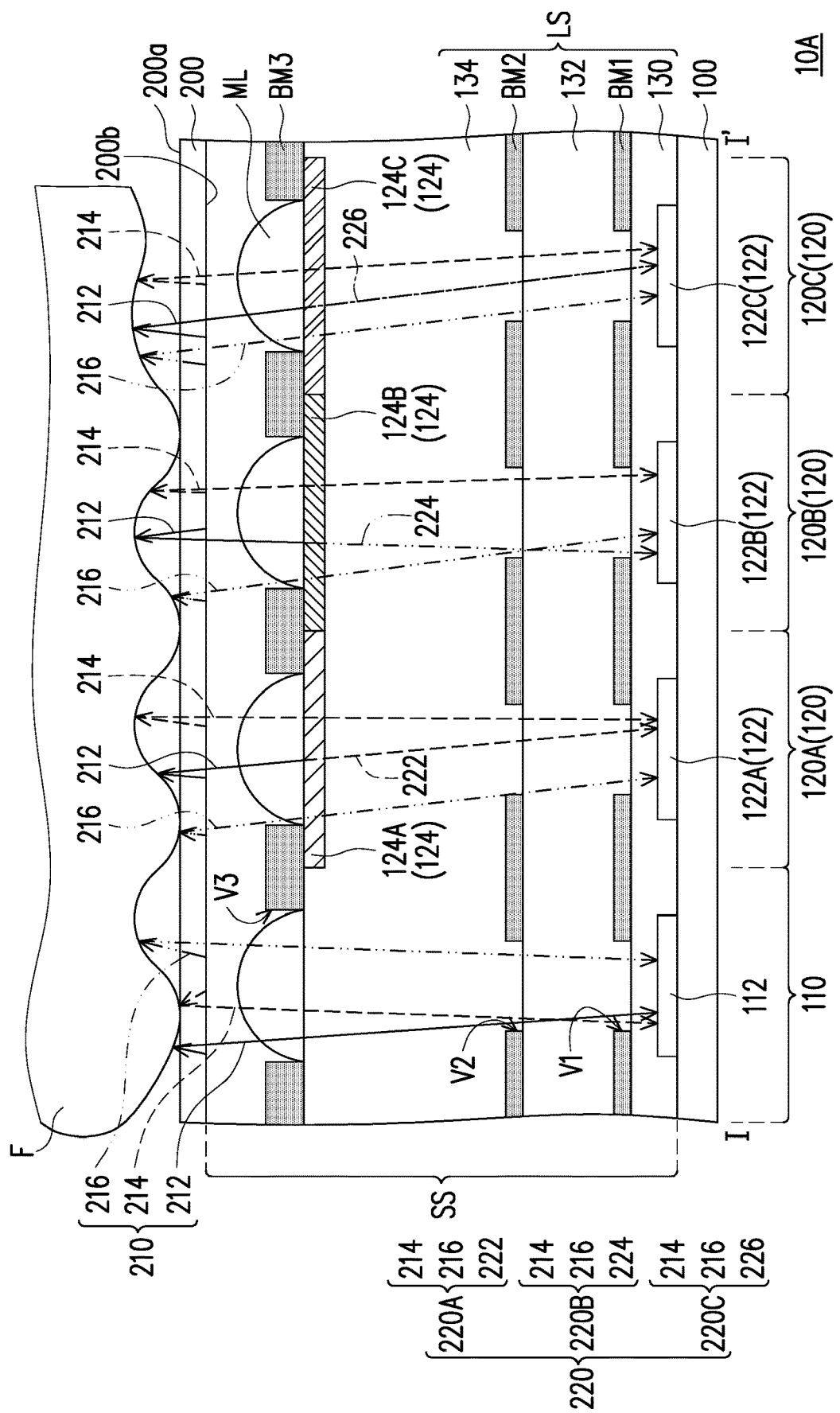
FIG. 2A is a schematic diagram of the first embodiment of a cross-section along section line I-I' in the sensing device of FIG. 1.

FIG. 2A is a schematic diagram of the first embodiment of a cross-section along section line I-I' in the sensing device of FIG. 1. It should be mentioned here that, FIG. 2A adopts the reference numerals of the embodiment of FIG. 1 and a portion of the content thereof, wherein the same or similar numerals are used to represent the same or similar devices and descriptions of the same technical content are omitted. The omitted portions are as described in the above embodiments and are not repeated herein.

Referring to FIG. 2A, a sensing device 10A includes a substrate 100, a light-emitting panel 200, and the sensing pixel array structure SS. In an embodiment, the substrate 100 may be a transparent substrate or a non-transparent substrate, and the material thereof may be a quartz substrate, a glass substrate, a polymer substrate, or other suitable materials, but the invention is not limited thereto. Various film layers for forming, for example, signal lines, driving elements, test elements, switch elements, storage capacitors, etc. may be disposed on the substrate 100.

In the present embodiment, the light-emitting panel 200 has a front side 200a and a back side 200b. In the following, the side of the light-emitting panel 200 close to or facing a finger F may be referred to as the front side 200a of the light-emitting panel 200, and the other side relative to the front side 200a of the light-emitting panel 200 may be referred to as the back side 200b of the light-emitting panel 200. In addition, the back side 200b of the light-emitting panel 200 may also be regarded as the side facing the sensing pixel array structures SS. That is, the back side 200b of the light-emitting panel 200 is located between the sensing pixel array structure SS and the front side 200a of the light-emitting panel 200. The light-emitting panel 200 is suitable for emitting light from the front side 200a, and therefore the front side 200a may be regarded as the light-emitting side of the light-emitting panel 200.

In the present embodiment, the light-emitting panel 200 is adapted to emit an initial light 210 with a first waveform. In an embodiment, the wavelength range covered by the first waveform may be determined according to the design of the light-emitting elements of the light-emitting panel 200. The initial light 210 with the first waveform is, for example, a combination of visible lights. For example, the initial light 210 with the first waveform may be formed by combining visible lights of different colors, so that the first waveform is in the range of 400 nm to 700 nm. For the convenience of description, the initial light 210 with the first waveform may be divided into a first short wavelength portion 212, a first long wavelength portion 214, and a first medium wavelength portion 216 according to the wavelength range.

In the present embodiment, the sensing pixel array structure SS is located on the back side 200b of the light-emitting panel 200, and the sensing pixel array structure SS is located between the substrate 100 and the light-emitting panel 200. In the present embodiment, the first sensing pixel structure 110 of the sensing pixel array structure SS includes a first sensing element 112. The first sensing pixel structure 110 provides the initial light 210 with the first waveform as a first sensing light to the first sensing element 112 for sensing. In other words, the first sensing pixel structure 110 may not change the waveform of the initial light 210 so that the first sensing light sensed by the first sensing element 112 has the same first waveform as the initial light 210. In other words, the first sensing light sensed by the first sensing element 112 is formed by, for example, the first short wavelength portion 212, the first long wavelength portion 214, and the first medium wavelength portion 216 of the initial light 210. In an embodiment, the first sensing element 112 may include various film layers and/or members (not shown) such as a read circuit structure, an electrode layer, or a sensing layer.

In the present embodiment, each of the second sensing pixel structures 120 of the sensing pixel array structure SS may include a second sensing element 122 and a light conversion layer 124. The light conversion layer 124 has wavelength conversion characteristics, and the absorption peak wavelength thereof is smaller than the excitation peak wavelength. The absorption peak wavelength of the light conversion layer 124 may be in the wavelength range of the first waveform, and the excitation peak wavelength of the light conversion layer 124 is, for example, in the range of 400 nm to 750 nm, but is not limited thereto. That is, the light conversion layer 124 may absorb a portion of the initial light 210 with the first waveform and convert the absorbed portion into light having a longer wavelength range. In an embodiment, the light conversion layer 124 may include quantum dots, phosphors, or the like. Therefore, the second sensing pixel structures 120 are adapted to adjust the initial light 210 with the first waveform to a second sensing light 220 to be provided to the second sensing elements 122 for sensing, wherein a second waveform of the second sensing light 220 is different from the first waveform of the initial light 210.

In the present embodiment, the first sensing pixel structure 110 and the second sensing pixel structures 120 further individually include a light-collimating structure LS and a lens ML sequentially stacked on the first sensing element 112 and the second sensing elements 122.

As shown in FIG. 2A, the light-collimating structure LS may include a first insulating layer 130, a first light-shielding layer BM1, a second insulating layer 132, a second light-shielding layer BM2, and a third insulating layer 134 sequentially stacked on the substrate 100. In an embodiment, the first insulating layer 130 covers, for example, the top surface and the side surface of the first sensing element 112 and the top surface and the side surface of each of the second sensing elements 122. The first light-shielding layer BM1 has, for example, a plurality of first openings V1, and the first openings V1 may expose a portion of the first insulating layer 130. In the present embodiment, the plurality of first openings V1 may correspond to the first sensing element 112 and each of the second sensing elements 122, respectively.

The second insulating layer 132, for example, completely fills the first openings V1 of the first light-shielding layer BM1 and covers the top surface of the first light-shielding layer BM1. The second light-shielding layer BM2 has, for example, a plurality of second openings V2, and the second openings V2 may expose a portion of the second insulating layer 132. In the present embodiment, the second openings V2 may correspond to the first openings V1. In this way, the first sensing element 112 and each of the second sensing elements 122 may receive the light regulated by the first openings V1 and the second openings V2 for sensing.

The third insulating layer 134, for example, completely fills the second openings V2 of the second light-shielding layer BM2 and covers the top surface of the second light-shielding layer BM2. In an embodiment, the material of the first insulating layer 130 and the second insulating layer 132 may include an organic material, such as an acrylic material, a silicone material, a polyimide material, an epoxy resin material, or a laminate of the above materials, but the invention is not limited thereto. The material of the first light-shielding layer BM1 and the second light-shielding layer BM2 may include a light-shielding material such as metal, black resin, or graphite, or a laminate of the above light-shielding materials, but the invention is not limited thereto. The material of the third insulating layer 134 may include an inorganic material or an organic material, wherein the inorganic material is, for example, silicon oxide, silicon nitride, silicon oxynitride, or a laminate of the above materials, and the organic material is, for example, an acrylic material, a siloxane material, a polyimide material, an epoxy resin material, or a laminate of the above materials. It should be noted that although the third insulating layer 134 in FIG. 2A is only shown as a single-layer structure, in other embodiments, the third insulating layer 134 may also be a multilayer structure. For example, the third insulating layer 134 may also have a two-layer, three-layer, or four-layer structure, and the number of layers and the material of the third insulating layer 134 may be adjusted according to design requirements, and the invention is not limited thereto.

A plurality of lenses ML are located between the light-collimating structure LS and the light-emitting panel 200. In the present embodiment, a third light-shielding layer BM3 is further provided on the light-collimating structure LS. The third light-shielding layer BM3 has, for example, a plurality of third openings V3, and the third openings V3 may expose a portion of the third insulating layer 134. In the present embodiment, the third openings V3 may correspond to the second openings V2. In an embodiment, the material of the third light-shielding layer BM3 may include a light-shielding material such as metal, black resin, or graphite, or a laminate of the above light-shielding materials, but the invention is not limited thereto. The lenses ML are disposed in the third openings V3, for example. The lenses ML may be lens structures with a larger central thickness than an edge thickness, such as symmetrical double-convex lenses, asymmetrical double-convex lenses, plano-convex lenses, or meniscus lenses. The lenses ML may improve light collimation, so that the issue of light leakage and light mixing caused by scattered light or refracted light may be reduced, thereby reducing light loss.

Moreover, the light-emitting direction of the light-emitting panel 200 is, for example, away from the sensing pixel array structure SS. As a result, when the finger F is close to the front side 200a of the light-emitting panel 200, the initial light 210 with the first waveform emitted by the light-emitting panel 200 may be reflected by the finger F, the initial light 210 with the first waveform reflected by the finger F may first pass through the lenses ML, the second openings V2, and the first openings V1 to improve collimation, and then enter the first sensing element 112 and each of the second sensing elements 122 so that the first sensing element 112 and each of the second sensing elements 122 may obtain a fingerprint signal of good quality, so that the sensing device 10A has good fingerprint identification.

The light conversion layer 124 of the second sensing pixel structures 120 is located between the second sensing elements 122 and the light-emitting panel 200. In the present embodiment, the light conversion layer 124 is located between the lenses ML and a second sensing element 122A, for example. Specifically, the light conversion layer 124 is located, for example, on the side of the third insulating layer 134 close to the lenses ML. Although it is shown in FIG. 2A that the light conversion layer 124 is directly in contact with the bottom of the lenses ML, in other embodiments, there may be a distance between the light conversion layer 124 and the lenses ML; or when the third insulating layer 134 has a multilayer structure, at least one layer of the multilayer structure is also spaced apart, as long as the light conversion layer 124 is located on the path of the initial light 210 with the first waveform, and the invention is not limited thereto.

In the present embodiment, the second sensing light 220 includes converted light obtained by converting a portion of the initial light 210 with the first waveform via the light conversion layer 124, and another portion of the initial light 210 with the first waveform passing through the light conversion layer 124 but not converted by the light conversion layer 124. According to the wavelength conversion characteristics, the second sensing pixel structures 120 may include three designs, such as a second sensing pixel structure 120A, a second sensing pixel structure 120B, and a second sensing pixel structure 120C. The second sensing pixel structure 120A may include a light conversion layer 124A for adjusting the initial light 210 with the first waveform to a second sensing light 220A and the second sensing element 122A sensing the second sensing light 220A; the second sensing pixel structure 120B may include a light conversion layer 124B for adjusting the initial light 210 with the first waveform to a second sensing light 220B and a second sensing element 122B sensing the second sensing light 220B; and the second sensing pixel structure 120C may include a light conversion layer 124C for adjusting the initial light 210 with the first waveform to a second sensing light 220C and a second sensing element 122C sensing the second sensing light 220C. However, in some embodiments, the plurality of second sensing pixel structures 120 may only have the same design, or the entire sensing device 10A may only include a single second sensing pixel structure 120.

The following illustrates the implementations of the second sensing light 220A, the second sensing light 220B, and the second sensing light 220C respectively obtained in the second sensing pixel structure 120A, the second sensing pixel structure 120B, and the second sensing pixel structure 120C. However, the invention is not limited to the following implementations.

In the second sensing pixel structure 120A, the wavelength conversion characteristics of the light conversion layer 124A can, for example, convert the first short wavelength portion 212 of the initial light 210 into a first converted light 222, but does not convert the first long wavelength portion 214 and the first medium wavelength portion 216 of the initial light 210. In other words, the wavelength range of the first short wavelength portion 212 may be the absorption wavelength range of the light conversion layer 124A, and the wavelength range of the first converted light 222 may be the excitation wavelength range of the light conversion layer 124A. Therefore, the second sensing element 122A of the second sensing pixel structure 120A may receive the first converted light 222 converted by the light conversion layer 124A and the first long wavelength portion 214 and the first medium wavelength portion 216 passing through the light conversion layer 124A but not converted by the light conversion layer 124A. As a result, the second sensing element 122A receives the second sensing light 220A formed by superimposing the first converted light 222, the first long wavelength portion 214, and the first medium wavelength portion 216 with each other. In some embodiments, the first short wavelength portion 212 of the initial light 210 may not be completely absorbed by the light conversion layer 124A, and therefore the second sensing light 220A may even include a portion of the unconverted first short wavelength portion 212. In some embodiments, the first short wavelength portion 212, the first long wavelength portion 214, and the first medium wavelength portion 216 are respectively shown in blue, red, and green, and the first converted light 222 is, for example, red. Compared with the initial light 210, the second sensing light 220A is, for example, more orange.

In the second sensing pixel structure 120B, the light conversion characteristics of the light conversion layer 124B can, for example, convert the first short wavelength portion 212 of the initial light 210 into a second converted light 224, but does not convert the first long wavelength portion 214 and the first medium wavelength portion 216 of the initial light 210. As a result, the second sensing element 122B receives the second sensing light 220B formed by superimposing the second converted light 224, the first long-wavelength portion 214, and the first medium wavelength portion 216 with each other. In some embodiments, the first short wavelength portion 212 of the initial light 210 may not be completely absorbed by the light conversion layer 124B, and therefore the second sensing light 220B may even include a portion of the unconverted first short wavelength portion 212. In some embodiments, the first short wavelength portion 212, the first long wavelength portion 214, and the first medium wavelength portion 216 are respectively shown in blue, red, and green, and the second converted light 224 is, for example, green. Compared with the initial light 210, the second sensing light 220B is more yellow and green.

In the second sensing pixel structure 120C, the light conversion characteristics of the light conversion layer 124C can, for example, convert the first short wavelength portion 212 of the initial light 210 into a third converted light 226, but does not convert the first long wavelength portion 214 and the first medium wavelength portion 216 of the initial light 210. As a result, the second sensing element 122C receives the second sensing light 220C formed by superimposing the third converted light 226, the first long-wavelength portion 214, and the first medium wavelength portion 216 with each other. In some embodiments, the first short wavelength portion 212 of the initial light 210 may not be completely absorbed by the light conversion layer 124C, and therefore the second sensing light 220C may even include a portion of the unconverted first short wavelength portion 212. In some embodiments, the wavelength range of the third converted light 226 is different from the wavelength range of the first short wavelength portion 212. Specifically, the wavelength range of the third converted light 226 is, for example, that the wavelength range of the first short wavelength portion 212 is shifted toward the long wavelength range. For example, the wavelength range of the third converted light 226 may be between the wavelength range of the first short wavelength portion 212 and the wavelength range of the first medium wavelength portion 216. In some embodiments, since the wavelength range of the third converted light 226 is shifted toward the long wavelength range compared to the first short wavelength portion 212, the second sensing light 220C exhibits light different from the initial light 210, for example.

The wavelength conversion effect of the light conversion layer 124 may change the wavelength range of light but does not significantly absorb light. Therefore, via the light conversion layer 124, the initial light 210 with the first waveform reflected by the finger F and incident on the second sensing pixel structures 120 may be adjusted to the second sensing light 220 with the second waveform, but does not cause significant light loss. In this way, the second sensing element 122A, the second sensing element 122B, and the second sensing element 122C may receive a sufficient amount of the second sensing light 220, thereby improving the accuracy of the sensing elements. In other words, the configuration of the light conversion layer 124 may enhance the strength of the signal received by the sensing elements, thereby improving the quality of the sensing device 10A to enhance the fingerprint anti-counterfeiting effect.

In some embodiments, the absorption spectrum of the first sensing element 112 and each of the second sensing elements 122 may be limited according to the design of the sensing layer material or the sensing structure. For example, a sensing element adopting silicon-rich oxide (SRO) as the sensing layer substantially has an absorption spectrum with a wavelength range of 480 nm to 520 nm, and a sensing element with a PIN diode structure substantially has an absorption spectrum with a wavelength range of 580 nm to 620 nm. Therefore, not all of the first short wavelength portion 212, the first long wavelength portion 214, and the first medium wavelength portion 216 of the initial light 210 may effectively cause the sensing elements to sense. For a smaller number of the second sensing pixel structures 120, the sensing efficiency of the second sensing elements 122 may be limited. However, in the present embodiment, the light conversion layer 124 is disposed in a small number of the second sensing pixel structures 120, and via the selection of the light conversion material, more of the light of the second sensing light 220 has a wavelength in the absorption spectrum of the sensing elements, thereby helping to improve the sensing sensitivity and the sensing efficiency of the second sensing elements 122. Therefore, the sensing device 10A may have an ideal anti-counterfeiting identification function.

Figure 2B:
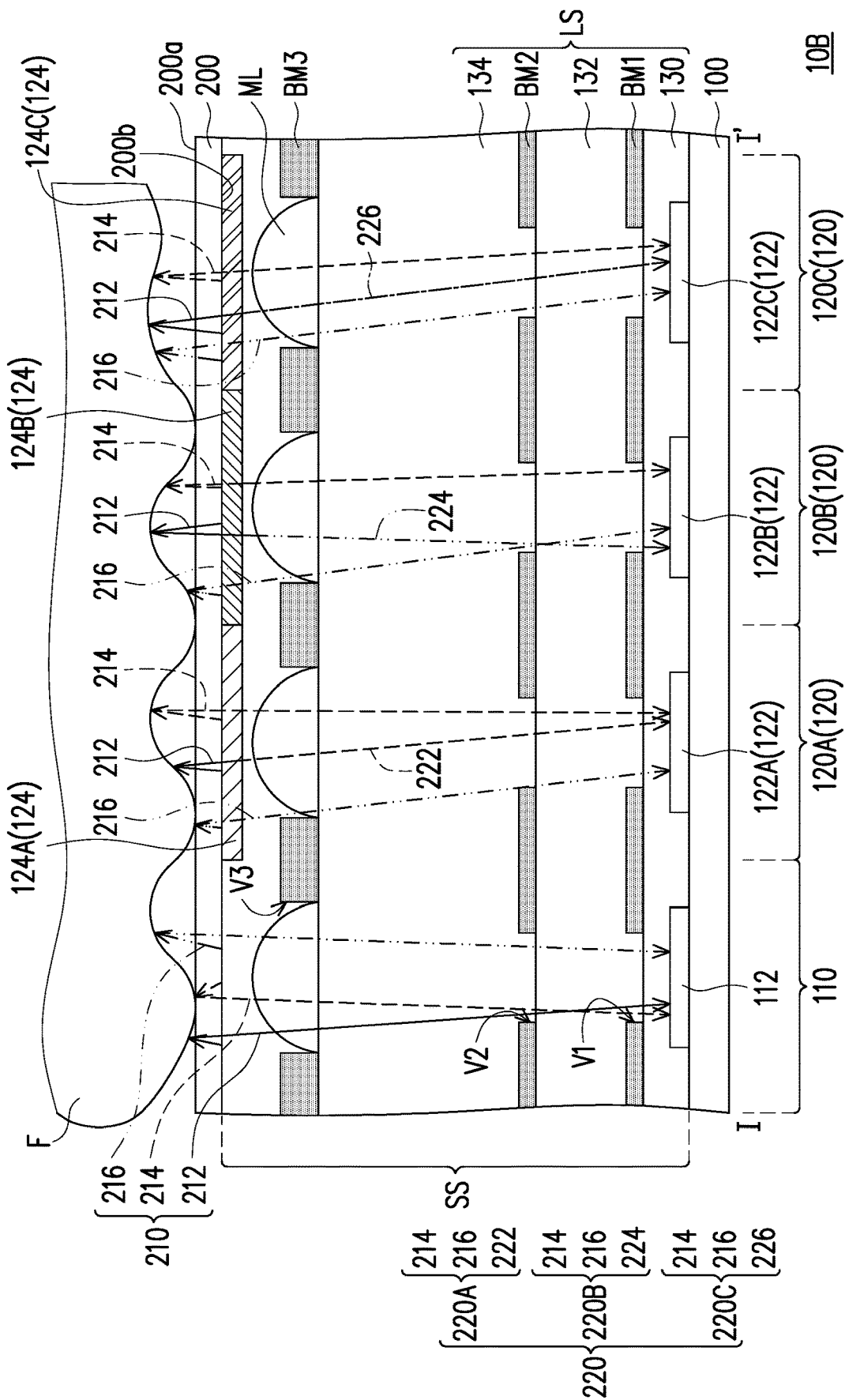
FIG. 2B is a schematic diagram of the second embodiment of a cross-section along section line I-I' in the sensing device of FIG. 1.

FIG. 2B is a schematic diagram of the second embodiment of a cross-section along section line I-I' in the sensing device of FIG. 1. It should be mentioned here that, FIG. 2B adopts the reference numerals of the embodiment of FIG. 2A and a portion of the content thereof, wherein the same or similar numerals are used to represent the same or similar devices and descriptions of the same technical content are omitted. The omitted portions are as described in the above embodiments and are not repeated herein.

In the present embodiment, the difference between a sensing device 10B shown in FIG. 2B and the sensing device 10A shown in FIG. 2A is that the light conversion layer 124 is located between the light-emitting panel 200 and the lenses ML.

Specifically, the light conversion layer 124 is located on the backside 200b of the light-emitting panel 200, for example. Therefore, the initial light 210 with the first waveform reflected by the finger F may be adjusted to the second sensing light 220 with the second waveform via the light conversion layer 124 first, and then collimation is improved by the lenses ML, the second openings V2, and the first openings V1. Generally, the second sensing light 220 adjusted by the light conversion layer 124 has more divergence than the initial light 210, and therefore the second sensing light 220 of the sensing device 10B also passes through the lenses ML so as to further improve the collimation thereof. As a result, each of the second sensing elements 122 may receive a fingerprint signal of good quality, thereby improving the fingerprint anti-counterfeiting effect of the sensing device 10B.

Figure 2C:
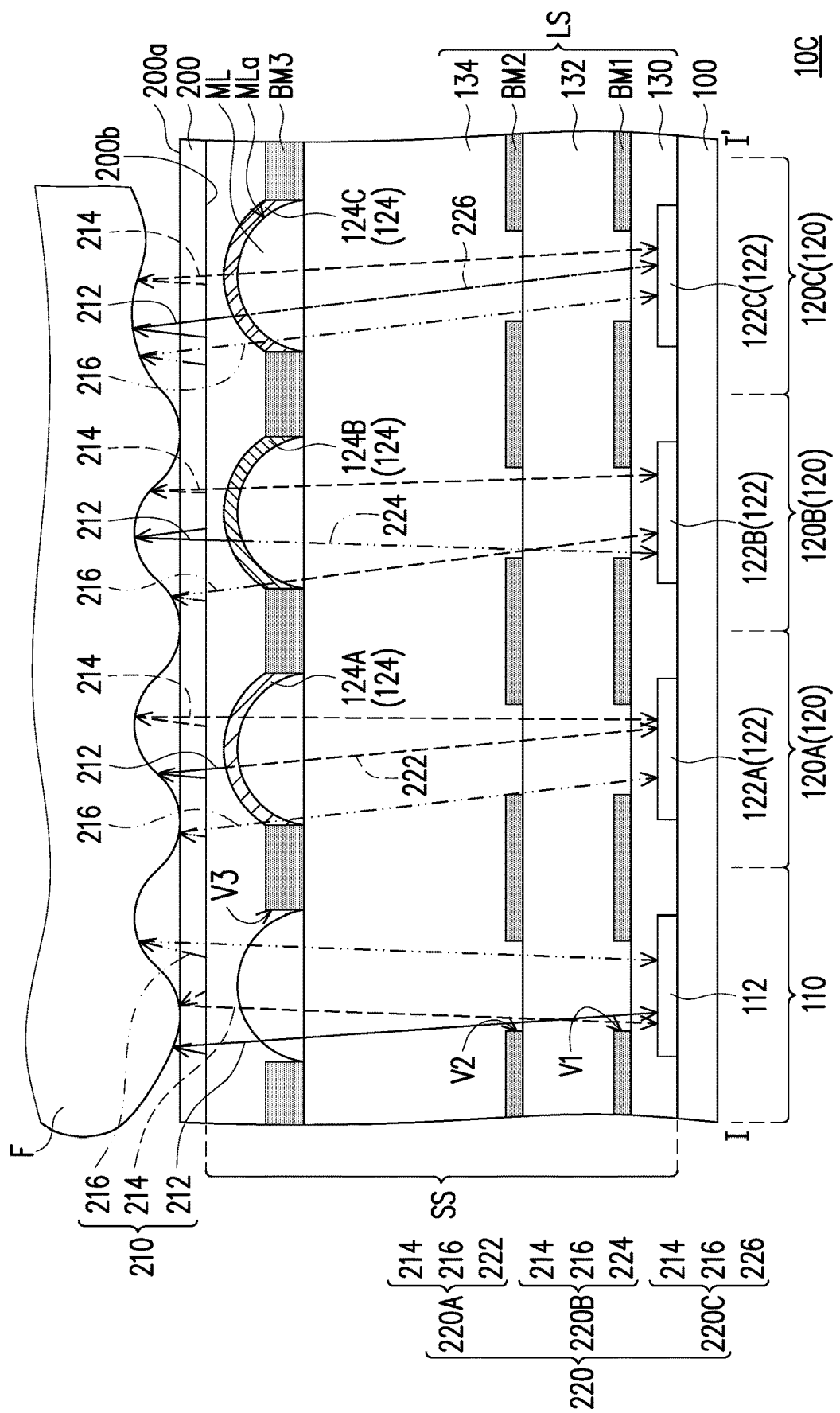
FIG. 2C is a schematic diagram of the third embodiment of a cross-section along section line I-I' in the sensing device of FIG. 1.

FIG. 2C is a schematic diagram of the third embodiment of a cross-section along section line I-I' in the sensing device of FIG. 1. It should be mentioned here that, FIG. 2C adopts the reference numerals of the embodiment of FIG. 2A and a portion of the content thereof, wherein the same or similar numerals are used to represent the same or similar devices and descriptions of the same technical content are omitted. The omitted portions are as described in the above embodiments and are not repeated herein.

In the present embodiment, the difference between a sensing device 10C shown in FIG. 2C and the sensing device 10A shown in FIG. 2A is that the light conversion layer 124 is disposed on a surface MLa of the lenses ML.

Specifically, the light conversion layer 124 is located, for example, on the surface MLa of the lenses ML facing the light-emitting panel 200. Therefore, the initial light 210 with the first waveform reflected by the finger F may be adjusted to the second sensing light 220 with the second waveform via the light conversion layer 124 first. In addition, the second sensing light 220 directly passes through the lenses ML, and then passes through the second openings V2 and the first openings V1 to improve collimation. In this way, the second sensing light 220 directly passes through the lenses ML to avoid divergence caused by the light conversion layer 124, thereby improving the fingerprint anti-counterfeiting effect of the sensing device 10C.

Figure 3:
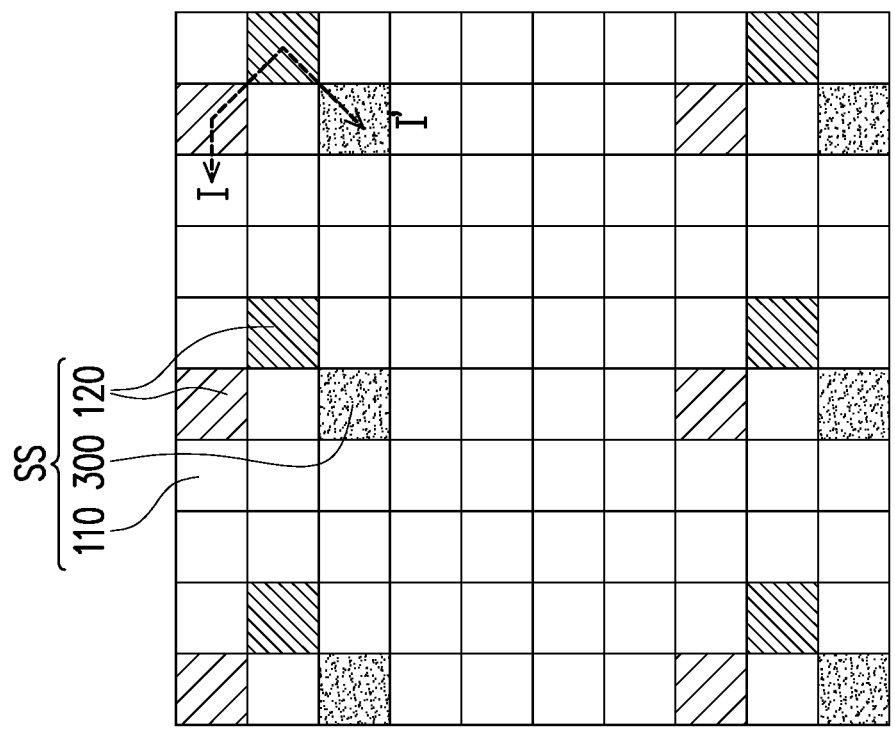
FIG. 3 is a schematic top view of a sensing device according to another embodiment of the invention.

FIG. 3 is a schematic top view of a sensing device according to another embodiment of the invention. It should be mentioned here that, FIG. 3 adopts the reference numerals of the embodiment of FIG. 1 and a portion of the content thereof, wherein the same or similar numerals are used to represent the same or similar devices and descriptions of the same technical content are omitted. The omitted portions are as described in the above embodiments and are not repeated herein.

In the present embodiment, the difference between a sensing device 20 shown in FIG. 3 and the sensing device 10 shown in FIG. 1 is that the sensing pixel array structure SS of the sensing device 20 further includes at least one third sensing pixel structure 300. Specifically, the sensing pixel array structure SS of the sensing device 20 includes a plurality of first sensing pixel structures 110, at least one second sensing pixel structure 120, and at least one third sensing pixel structure 300 arranged in an array.

In an embodiment, the third sensing pixel structures 300 may be used for anti-counterfeiting identification similarly to the second sensing pixel structures 120, for example. For example, the third sensing pixel structures 300 may be used to distinguish anti-counterfeiting identification information different from the second sensing pixel structures 120, thereby helping to improve the accuracy of the identification result. As shown in FIG. 3, the number of the second sensing pixel structures 120 may be more than the number of the third sensing pixel structures 300.

In the present embodiment, although a plurality of third sensing pixel structures 300 are used as an example, the invention is not limited thereto. In some embodiments, the sensing pixel structures arranged in an array to form the sensing pixel array structure SS may include only a single third sensing pixel structure 300.

In the present embodiment, the ratio of the configuration area of the first sensing pixel structures 110 in the overall sensing pixel array structure SS is greater than the ratio of the configuration area of the second sensing pixel structures 120 and the third sensing pixel structures 300 in the overall sensing pixel array structure SS. For example, the total configuration area of the second sensing pixel structures 120 and the third sensing pixel structures 300 preferably occupies less than 10% of the total configuration area of the sensing pixel array structure SS, but more than 0%. In other words, the first sensing pixel structures 110 preferably occupy more than 90% but less than 100% of the configuration area of the overall sensing pixel array structure SS.

The arrangement of the third sensing pixel structures 300 in the sensing pixel array structure SS may be adjusted according to different requirements. For example, as shown in FIG. 3, the sensing device 20 is, for example, replacing one of the plurality of second sensing pixel structures 120 of the sensing device 10 with the third sensing pixel structure 300. In other words, in the sensing pixel array structure SS of the sensing device 20, there are two second sensing pixel structures 120 and one third sensing pixel structure 300 as a group, and the second sensing pixel structures 120 and the third sensing pixel structure 300 of each group are arranged in a staggered arrangement along the second direction D2. Here, the third sensing pixel structure 300 is, for example, located on one side of each group of sensing pixel structures, and is only adjacent to one second sensing pixel structure 120. In other embodiments, the third sensing pixel structure 300 may also be located in the middle portion of each group of sensing pixel structures and adjacent to two second sensing pixel structures 120; or the third sensing pixel structure 300 may not be arranged adjacent to the second sensing pixel structures 120 but scattered. Those having ordinary skill in the art may adjust the number and arrangement of the third sensing pixel structure 300 according to design requirements, and the invention is not limited thereto.

In the present embodiment, the third sensing pixel structure 300 may have a different structural design from the first sensing pixel structures 110 and the second sensing pixel structures 120 to provide different sensing functions. For example, the third sensing pixel structure 300 may adjust the initial light with the first waveform to a third sensing light having a third waveform to sense the third sensing light. The first sensing pixel structures 110, the second sensing pixel structures 120, and the third sensing pixel structure 300 respectively sense sensing light with different waveforms to generate more types of identification signals. Thus, the accuracy of the sensing device 20 is improved.

Hereinafter, implementations applicable to the first sensing pixel structures, the second sensing pixel structures, and the third sensing pixel structures in the above embodiments are illustrated by way of example, but the invention is not limited to the following implementations.

Figure 4A:
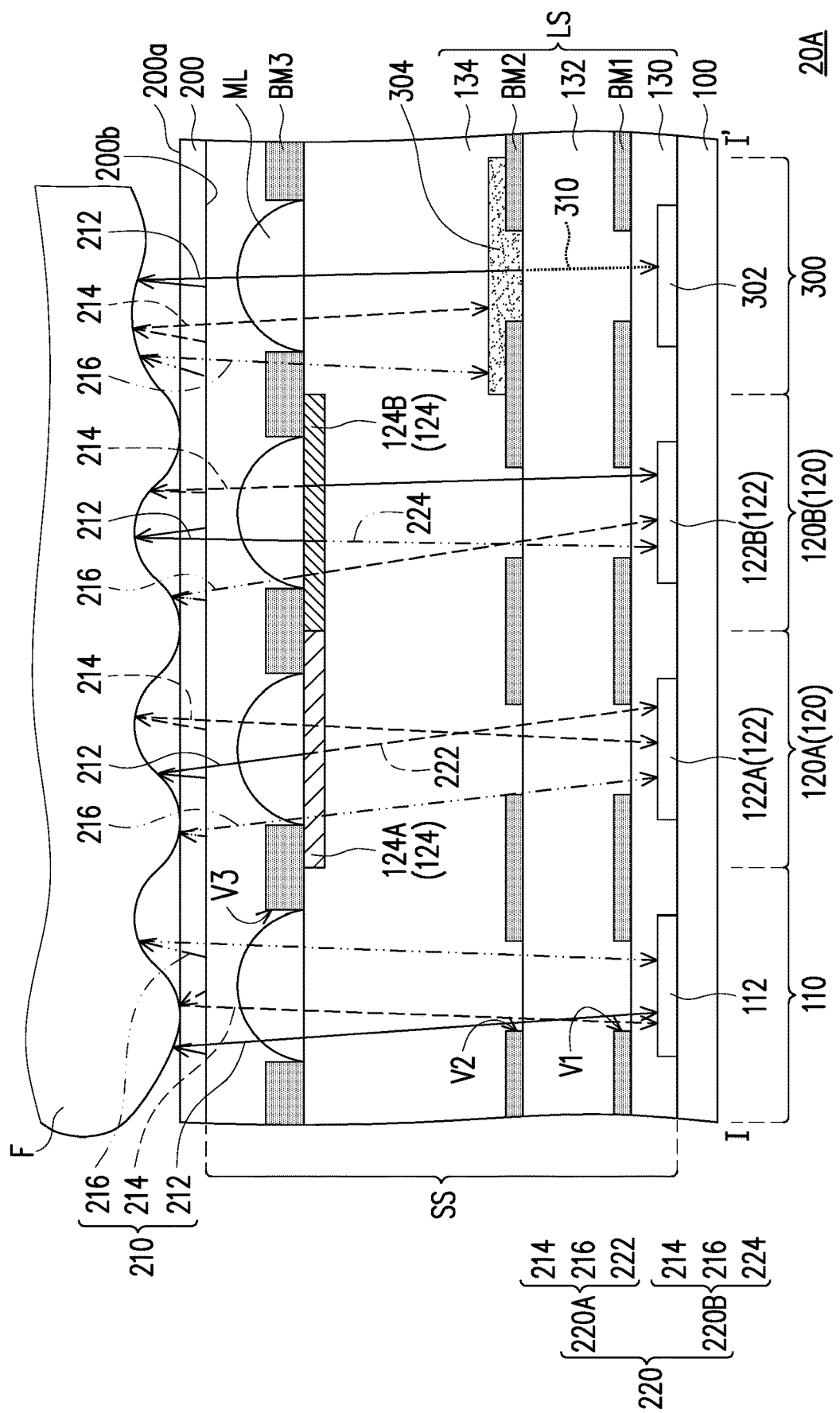
FIG. 4A is a schematic diagram of the first embodiment of a cross-section along section line I-I' in the sensing device of FIG. 3.

FIG. 4A is a schematic diagram of the first embodiment of a cross-section along section line I-I' in the sensing device of FIG. 3. It should be mentioned here that, FIG. 4A adopts the reference numerals of the embodiment of FIG. 2A and a portion of the content thereof, wherein the same or similar numerals are used to represent the same or similar devices and descriptions of the same technical content are omitted. The omitted portions are as described in the above embodiments and are not repeated herein.

In the present embodiment, the difference between a sensing device 20A shown in FIG. 4A and the sensing device 10A shown in FIG. 2A is that the second sensing pixel structure 120C of the sensing device 10A is replaced by the third sensing pixel structure 300 in the sensing device 20A. Specifically, the sensing pixel array structure SS of the sensing device 20A includes, for example, the first sensing pixel structure 110, the second sensing pixel structure 120A, the second sensing pixel structure 120B, and the third sensing pixel structure 300. In other embodiments, the third sensing pixel structure 300 may replace the second sensing pixel structure 120A, the second sensing pixel structure 120B, the second sensing pixel structure 120C, or a combination of two of the above sensing pixel structures, and the invention is not limited thereto.

In the present embodiment, each of the third sensing pixel structures 300 of the sensing pixel array structure SS may include a third sensing element 302 and a color filter layer 304. The third sensing pixel structure 300 may not include a light conversion layer or a light conversion material, such as quantum dots, phosphors, and the like. The color filter layer 304 has filter characteristics and may be used to shield and/or absorb light in a specific wavelength range, while only allowing light in another specific wavelength range to pass. In other words, the color filter layer 304 may shield and/or absorb a portion of the initial light 210 with the first waveform and allow another portion of the initial light 210 with the first waveform to pass. In an embodiment, the color filter layer 304 may be any color filter layer known to those having ordinary skill in the art and used in a sensing device. Therefore, the third sensing pixel structure 300 is adapted to adjust the initial light 210 with the first waveform to a third sensing light 310 to be provided to the third sensing element 302 for sensing, wherein a third waveform of the third sensing light 310 is different from the first waveform of the initial light 210.

In the present embodiment, the third sensing pixel structure 300 further includes the light-collimating structure LS and the lens ML sequentially stacked on the third sensing element 302. Specifically, the structural design and configuration relationship of the light-collimating structure LS and the lens ML are as provided in the description of the above embodiments, and are not repeated herein.

The color filter layer 304 of the third sensing pixel structure 300 is located between the third sensing element 302 and the light-emitting panel 200, for example. In the present embodiment, the color filter layer 304, for example, completely fills the second opening V2 of the second light-shielding layer BM2 and covers a portion of the top surface of the second light-shielding layer BM2, but the invention is not limited thereto. In other embodiments, there may be a distance between the color filter layer 304 and the second light-shielding layer BM2; or when the third insulating layer 134 is a multilayer structure, at least one layer of the multilayer structure is also spaced apart, as long as the color filter layer 304 is located on the path of the initial light 210 with the first waveform.

In the present embodiment, the third sensing light 310 only includes a portion of the initial light 210 passing through the color filter layer 304. According to the light filter characteristics of the third sensing pixel structure 300, the third sensing pixel structure 300 may only allow light in a short wavelength range, a medium wavelength range, or a long wavelength range to pass. For example, in the case that the first waveform of the initial light 210 is divided into the first short wavelength portion 212, the first long wavelength portion 214, and the first medium wavelength portion 216, and the third sensing pixel structure 300 only allows light of the first short wavelength portion 212 to pass, the first long wavelength portion 214 and the first medium wavelength portion 216 are shielded and/or absorbed by the color filter layer 304, and only the first short wavelength portion 212 may pass through the color filter layer 304 to serve as the third sensing light 310 and be sensed by the third sensing element 302. In this way, after the initial light 210 with the first waveform passes through the color filter layer 304, only the first short wavelength portion 212 remains to be provided to the third sensing element 302. Compared with the second sensing elements 122 of the second sensing pixel structures 120, the third sensing element 302 receives a relatively smaller amount of light, but may receive light with a more concentrated wavelength range. Therefore, with the second sensing pixel structures 120 and the third sensing pixel structure 300, a plurality of sensing signals may be obtained, thus helping to improve the accuracy of the identification result. In some embodiments, the first short wavelength portion 212, the first long wavelength portion 214, and the first medium wavelength portion 216 are respectively shown in blue, red, and green, and the third sensing light 310 appears as blue light, for example, but is not limited thereto. In other embodiments, the color filter layer 304 may allow only the first long wavelength portion 214 to pass, or only allow the first medium wavelength portion 216 to pass based on material selection.

Based on the above, with the second sensing pixel structures having the light conversion layer and the third sensing pixel structure having the color filter layer, different anti-counterfeiting identification information may be distinguished to increase the types of information determined by the sensing device 20A, thereby improving the accuracy of the identification result.

Figure 4B:
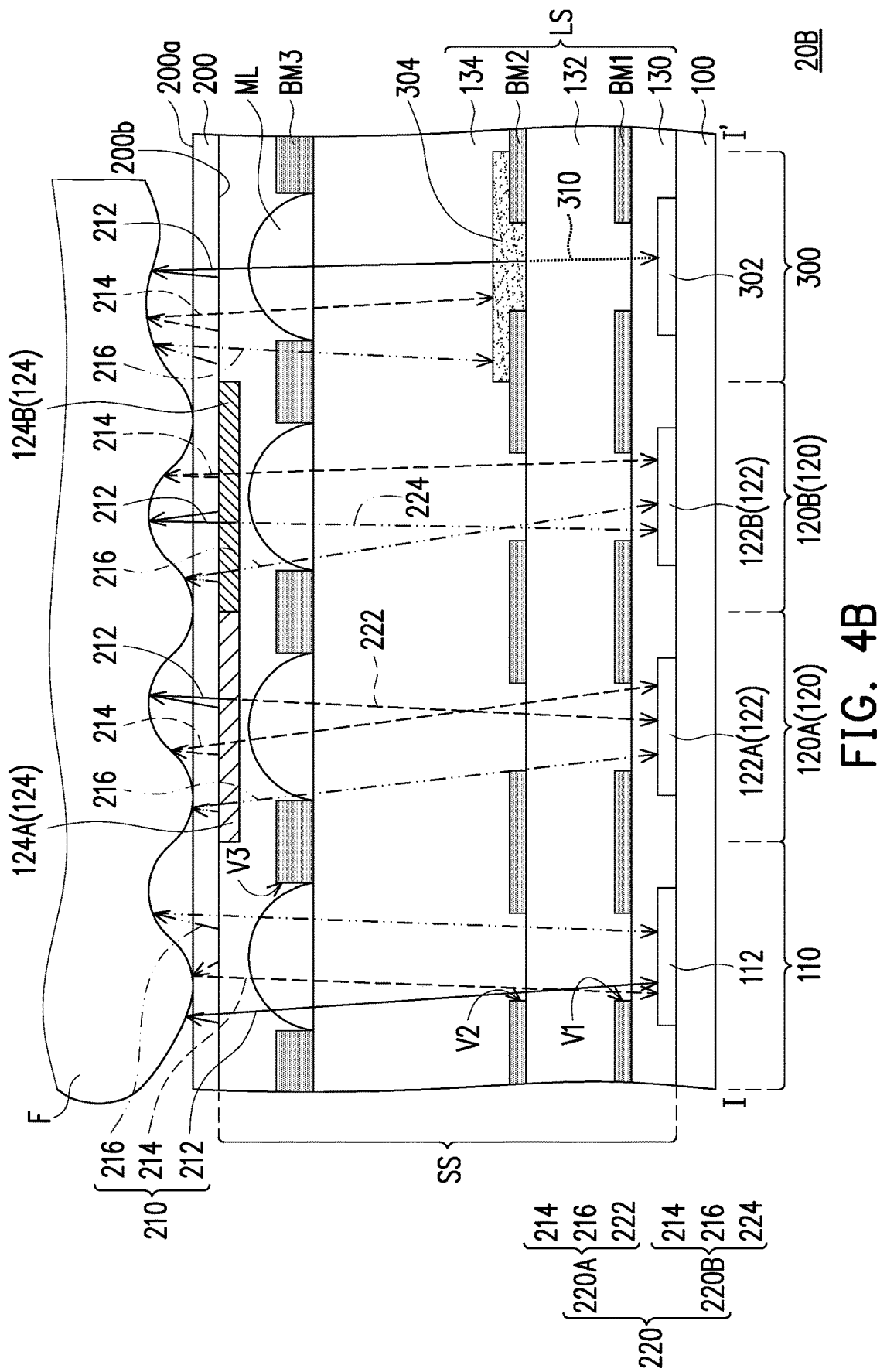
FIG. 4B is a schematic diagram of the second embodiment of a cross-section along section line I-I' in the sensing device of FIG. 3.

FIG. 4B is a schematic diagram of the second embodiment of a cross-section along section line I-I' in the sensing device of FIG. 3. It should be mentioned here that, FIG. 4B adopts the reference numerals of the embodiment of FIG. 4A and a portion of the content thereof, wherein the same or similar numerals are used to represent the same or similar devices and descriptions of the same technical content are omitted. The omitted portions are as described in the above embodiments and are not repeated herein.

In the present embodiment, the difference between a sensing device 20B shown in FIG. 4B and the sensing device 20A shown in FIG. 4A is that the light conversion layer 124 is located between the light-emitting panel 200 and the lenses ML. Specifically, the light conversion layer 124A of the second sensing pixel structure 120A and the light conversion layer 124B of the second sensing pixel structure 120B are located between the light-emitting panel 200 and the lenses ML. As a result, the scattered light caused by the light conversion layer 124A and the light conversion layer 124B may first pass through the lenses ML, the second openings V2, and the first openings V1 to improve collimation. In this way, the second sensing element 122A and the second sensing element 122B may obtain a fingerprint signal of good quality, so that the sensing device 20B has a good fingerprint anti-counterfeiting effect.

Figure 4C:
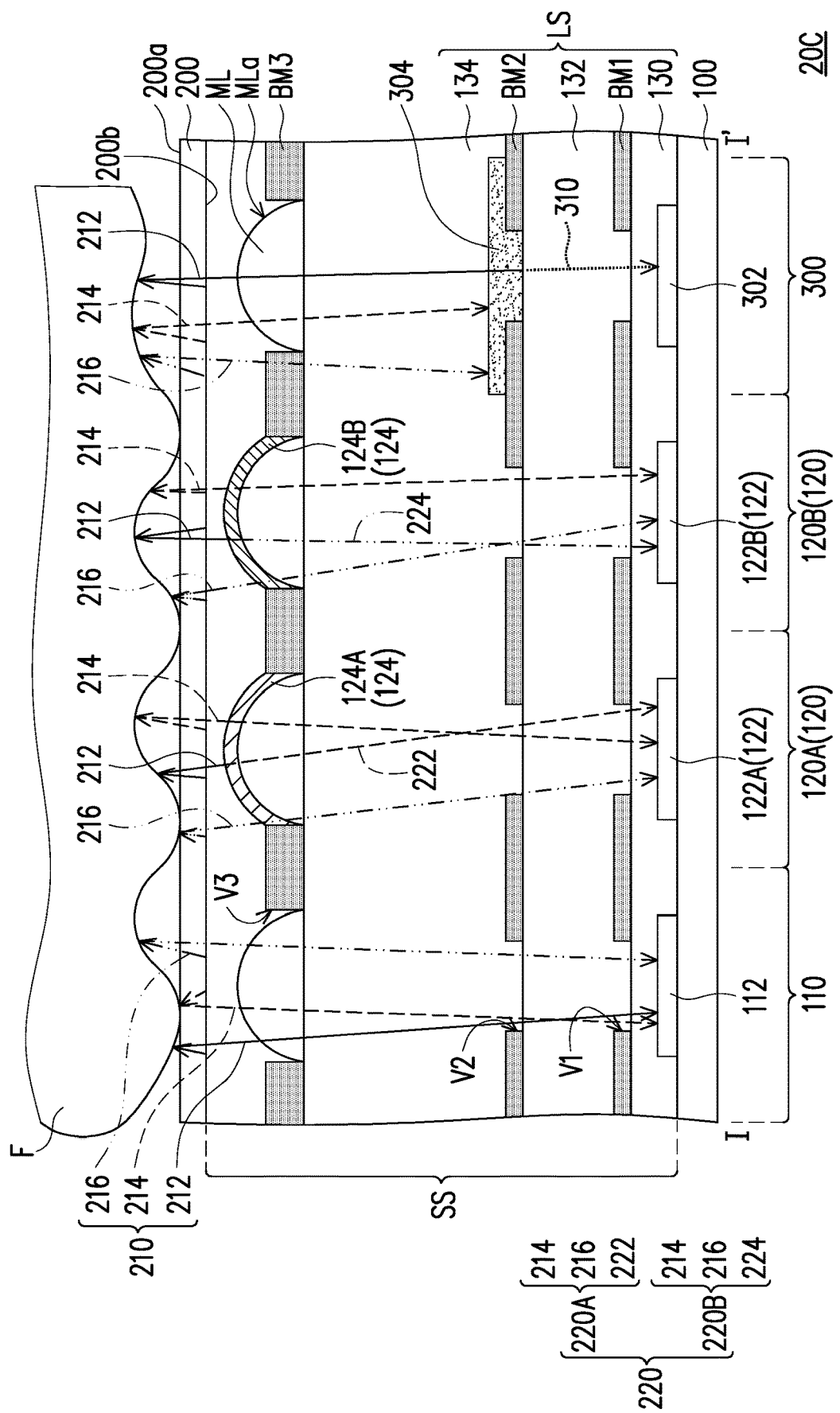
FIG. 4C is a schematic diagram of the third embodiment of a cross-section along section line I-I' in the sensing device of FIG. 3.

FIG. 4C is a schematic diagram of the third embodiment of a cross-section along section line I-I' in the sensing device of FIG. 3. It should be mentioned here that, FIG. 4C adopts the reference numerals of the embodiment of FIG. 4A and a portion of the content thereof, wherein the same or similar numerals are used to represent the same or similar devices and descriptions of the same technical content are omitted. The omitted portions are as described in the above embodiments and are not repeated herein.

In the present embodiment, the difference between a sensing device 20C shown in FIG. 4C and the sensing device 20A shown in FIG. 4A is that the light conversion layer 124 is disposed on the surface MLa of the lenses ML. Specifically, the light conversion layer 124A of the second sensing pixel structure 120A and the light conversion layer 124B of the second sensing pixel structure 120B are disposed on the surface MLa of the lenses ML. As a result, the scattered light caused by the light conversion layer 124A and the light conversion layer 124B directly passes through the lenses ML to improve collimation. Then, the collimation is further improved via the second openings V2 and the first openings V1, so that the sensing device 20C has a good fingerprint anti-counterfeiting effect.

In some alternative embodiments, the light conversion layer 124A and the light conversion layer 124B may be located in the same film position as the color filter layer 304, that is, located between the third insulating layer 134 and the second light-shielding layer BM2.

Based on the above, the sensing device of the invention is provided with first sensing pixel structures and at least one second sensing pixel structure that may respectively sense sensing light with different waveforms to generate different identification signals. As a result, the sensing device may analyze different signals via an algorithm to determine whether the fingerprint signal sensed by the sensing pixel array structure is abnormal, so as to identify the authenticity of the fingerprint signal obtained. Moreover, the light conversion layer of the second sensing pixel structure adjusts the initial light into sensing light with different waveforms. Therefore, while avoiding loss of light, the strength, the sensing sensitivity, and the sensing efficiency of the signal received by the sensing elements may be improved, thereby improving the quality of the sensing device and enhancing the fingerprint anti-counterfeiting effect.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A sensing device, comprising:
a light-emitting panel adapted to emit an initial light with a first waveform; and
a sensing pixel array structure located on a back side of the light-emitting panel, wherein the sensing pixel array structure comprises:
a plurality of first sensing pixel structures, wherein each of the first sensing pixel structures comprises a first sensing element, and the initial light with the first waveform reflected by a to-be sensed object is served as a first sensing light received by the first sensing element for sensing;
at least one second sensing pixel structure, wherein the at least one second sensing pixel structure comprises a second sensing element and a light conversion layer, the light conversion layer is located between the second sensing element and the light-emitting panel, the light conversion layer has an excitation peak wavelength and the excitation peak wavelength is in a range of 400 nm to 750 nm, and the light conversion layer of the at least one second sensing pixel structure is adapted to convert the initial light with the first waveform reflected by a to-be sensed object to a second sensing light received by the second sensing element for sensing, and the second sensing light has a second waveform different from the first waveform; and at least one third sensing pixel structure, wherein the at least one third sensing pixel structure comprises a third sensing element and a color filter layer, the color filter layer is located between the third sensing element and the light-emitting panel, the color filter layer has filter characteristics to shield and/or absorb light in a specific wavelength range while only allowing light in another specific wavelength range to pass, the color filter layer of the at least one third sensing pixel structure is adapted to adjust the initial light with the first waveform to a third sensing light to be provided to the third sensing element for sensing, and the third sensing light has a third waveform different from the first waveform and the second waveform, wherein the second sensing light comprises a converted light obtained by the light conversion layer converting a portion of the reflected initial light with the first waveform and another portion of the reflected initial light with the first waveform, the first waveform of the reflected initial light comprises a first wavelength portion and a second wavelength portion in a longer wavelength range than the first wavelength portion, the converted light comprises a converted wavelength portion converted from the first wavelength portion of the reflected initial light with the first waveform, and the converted wavelength portion is in a wavelength range overlapping the second wavelength portion.

2. The sensing device of claim 1, wherein the light conversion layer comprises a quantum dot.

3. The sensing device of claim 1, wherein the second sensing light comprises a converted light obtained by converting a portion of the initial light with the first waveform via the light conversion layer and another portion of the initial light with the first waveform passing through the light conversion layer but not converted by the light conversion layer.

4. The sensing device of claim 1, wherein the at least one second sensing pixel structure further comprises a light-collimating structure and a lens sequentially stacked on the second sensing element.

5. The sensing device of claim 4, wherein the light conversion layer of the at least one second sensing pixel structure is located between the lens and the second sensing element.

6. The sensing device of claim 4, wherein the light conversion layer of the at least one second sensing pixel structure is located between the light-emitting panel and the lens.

7. The sensing device of claim 1, wherein a ratio of the at least one second sensing pixel structure and the at least one third sensing pixel structure to the configuration area of the overall sensing pixel array structure is less than 10%, but more than 0%.

8. The sensing device of claim 1, wherein the first waveform is in a wavelength range of 400 nm to 700 nm.

9. A sensing device, comprising:
a sensing pixel array structure comprising a plurality of first sensing pixel structures and at least one second sensing pixel structure and at least one third sensing pixel structure arranged in an array, wherein, each of the first sensing pixel structures comprises a first sensing element, an initial light with a first waveform reflected by a to-be sensed object is served as a first sensing light, and the first sensing element receives the first sensing light for sensing, the at least one second sensing pixel structure comprises a second sensing element, the at least one second sensing pixel structure is adapted to convert the initial light with the first waveform reflected by a to-be sensed object to a second sensing light with a second waveform, the second sensing element receives the second sensing light with the second waveform for sensing, and the second waveform of the second sensing light is different from the first waveform, and the at least one third sensing pixel structure comprises a third sensing element and a color filter layer, the color filter layer is located between the third sensing element and the light- emitting panel, the color filter layer has filter characteristics to shield and/or absorb light in a specific wavelength range while only allowing light in another specific wavelength range to pass, the color filter layer of the at least one third sensing pixel structure is adapted to adjust the initial light with the first waveform to a third sensing light to be provided to the third sensing element for sensing, and the third sensing light has a third waveform different from the first waveform and the second waveform, wherein the second sensing light comprises a converted light obtained by converting a portion of the reflected initial light with the first waveform and another portion of the reflected initial light with the first waveform, the first waveform of the reflected initial light comprises a first wavelength portion and a second wavelength portion in a longer wavelength range than the first wavelength portion, the converted light comprises a converted wavelength portion converted from the first wavelength portion of the reflected initial light with the first waveform, and the converted wavelength portion is in a wavelength range overlapping the second wavelength portion.

10. The sensing device of claim 1, wherein the converted wavelength portion is in the wavelength range of red.

11. The sensing device of claim 9, wherein the converted wavelength portion is in the wavelength range of red.

12. A sensing device, comprising:
a light-emitting panel adapted to emit an initial light with a first waveform; and
a sensing pixel array structure located on a back side of the light-emitting panel, wherein
the sensing pixel array structure comprises:
a plurality of first sensing pixel structures, wherein each of the first sensing pixel structures comprises a first sensing element, and the initial light with the first waveform reflected by a to-be sensed object is served as a first sensing light received by the first sensing element for sensing; and
at least one second sensing pixel structure, arranged in groups of three, each group comprising three second sensing pixel structures staggered along a V shape path, two adjacent second sensing pixel structures being spaced in a first direction by three first sensing pixel structures, and two adjacent groups of the second sensing pixel structures being spaced in a second direction by four rows of the first sensing pixel structures, wherein the at least one second sensing pixel structure comprises a second sensing element and a light conversion layer, the light conversion layer is located between the second sensing element and the light-emitting panel, the at least one second sensing pixel structure is adapted to convert the initial light with the first waveform reflected by a to-be sensed object to a second sensing light received by the second sensing element for sensing, and the second sensing light has a second waveform different from the first waveform.

13. The sensing device of claim 12, wherein the light conversion layer has an excitation peak wavelength and the excitation peak wavelength is in a range of 400 nm to 750 nm.

14. The sensing device of claim 12, wherein the second sensing light comprises a converted light obtained by the light conversion layer converting a portion of the reflected initial light with the first waveform and another portion of the reflected initial light with the first waveform, the first waveform of the reflected initial light comprises a first wavelength portion and a second wavelength portion in a longer wavelength range than the first wavelength portion, the converted light comprises a converted wavelength portion converted from the first wavelength portion of the reflected initial light with the first waveform, and the converted wavelength portion is in a wavelength range overlapping the second wavelength portion.

* * * * *